(12) United States Patent
Dotta et al.

(10) Patent No.: US 7,327,041 B2
(45) Date of Patent: Feb. 5, 2008

(54) SEMICONDUCTOR PACKAGE AND A METHOD FOR PRODUCING THE SAME

(75) Inventors: Yoshihisa Dotta, Nara (JP); Kazuo Tamaki, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 89 days.

(21) Appl. No.: 10/154,834

(22) Filed: May 28, 2002

(65) Prior Publication Data

US 2002/0197771 A1 Dec. 26, 2002

(30) Foreign Application Priority Data

May 28, 2001 (JP) ............... 2001-159731

(51) Int. Cl.
*H01L 23/48* (2006.01)
(52) U.S. Cl. ...................................... 257/783
(58) Field of Classification Search ................ 257/678, 257/734–738, 620, 666, 778, 779, 783, E23.049
See application file for complete search history.

(56) References Cited

U.S. PATENT DOCUMENTS

| | | | |
|---|---|---|---|
| 5,936,304 A * | 8/1999 | Lii et al. ..................... 257/701 |
| 6,260,264 B1 * | 7/2001 | Chen et al. ................... 29/832 |
| 6,271,588 B1 * | 8/2001 | Ohuchi ........................ 257/734 |
| 6,335,563 B1 * | 1/2002 | Hashimoto .................. 257/632 |
| 6,392,143 B1 * | 5/2002 | Koshio ....................... 174/52.4 |
| 6,451,671 B1 * | 9/2002 | Yamada ....................... 438/460 |
| 6,455,920 B2 * | 9/2002 | Fukasawa et al. ........... 257/620 |
| 6,476,501 B1 * | 11/2002 | Ohuchi et al. .............. 257/778 |
| 6,590,291 B2 * | 7/2003 | Akagawa ..................... 257/774 |
| 6,613,694 B2 * | 9/2003 | Ohuchi et al. .............. 438/759 |
| 6,683,386 B2 * | 1/2004 | Bai .............................. 257/778 |
| 6,717,245 B1 * | 4/2004 | Kinsman et al. ............ 257/678 |
| 6,797,544 B2 * | 9/2004 | Sakai et al. ................. 438/121 |
| 6,897,566 B2 * | 5/2005 | Su ............................... 257/778 |
| 6,926,796 B1 * | 8/2005 | Nishida et al. ............. 156/312 |
| 7,029,949 B2 * | 4/2006 | Farnworth et al. .......... 438/113 |
| 2001/0028104 A1 * | 10/2001 | Fukatsu et al. ............. 257/685 |
| 2001/0036711 A1 * | 11/2001 | Urushima .................... 438/460 |
| 2002/0004258 A1 * | 1/2002 | Nakayama et al. ......... 438/107 |
| 2002/0185747 A1 * | 12/2002 | Hashimoto ................... 257/778 |
| 2003/0052340 A1 * | 3/2003 | Tuttle ......................... 257/200 |
| 2004/0012088 A1 * | 1/2004 | Fukasawa et al. ........... 257/737 |
| 2005/0090026 A1 * | 4/2005 | Otaki ........................... 438/14 |

FOREIGN PATENT DOCUMENTS

| | | |
|---|---|---|
| JP | 61-50344 A | 3/1986 |
| JP | 02-158156 A | 6/1990 |
| JP | 03-253062 A | 11/1991 |
| JP | 06-64379 A | 3/1994 |
| JP | 08-255811 A | 10/1996 |
| JP | 09-036143 A | 2/1997 |
| JP | 09-219421 A | 8/1997 |
| JP | 11-74230 A | 3/1999 |
| JP | 2000-11129 A | 1/2000 |
| JP | 2000-208559 A | 7/2000 |
| JP | 2000-294519 A | 10/2000 |
| JP | 2001-060642 A | 3/2001 |
| JP | 2001-094005 A | 4/2001 |
| KR | 2000-0071256 A | 11/2000 |

* cited by examiner

*Primary Examiner*—Nathan W. Ha
(74) *Attorney, Agent, or Firm*—Birch, Stewart, Kolasch & Birch, LLP

(57) ABSTRACT

A semiconductor package includes: a semiconductor chip having circuits formed on a surface, and having a thickness of 0.5 μm or more and 100 μm or less; and an adhesive resin layer provided so as to cover the surface of the semiconductor chip on which the circuits are provided.

9 Claims, 5 Drawing Sheets

Grinding from the back surface and CMP or etching

PRIOR ART

SEMICONDUCTOR PACKAGE AND A METHOD FOR PRODUCING THE SAME

This nonprovisional application claims priority under 35 U.S.C. 119(a) on Patent Application No. 2001-159731 filed in JAPAN on May 28, 2001, which is herein incorporated by reference.

BACKGROUND OF THE INVENTION

1. Field of the Invention

The present invention relates to a semiconductor package which can be readily mounted on a flexible circuit board which can be bent, and a production method thereof.

2. Description of the Related Art

Recently, since electronic devices have been becoming lighter, thinner and smaller, a demand for a small and light semiconductor device for mounting on such an electronic device is increasing. For satisfying such a demand, a miniaturized semiconductor package such as a BGA (Ball Grid Array) type or CSP (Chip Scale Package) type semiconductor package has been widely used. As used herein, a semiconductor package refers to a semiconductor chip with active elements such as diodes and transistors, and circuitry such as electrodes and wiring formed on a surface, and the surface being molded with a resin or covered with a resin layer.

FIG. 6A is a cross-sectional view showing an exemplary semiconductor package of a conventional QFP (QuadFlat-Package)type. In such a semiconductor package, a semiconductor chip 22 is mounted on a die pad 30 with a die bond adhesive 25 provided therebetween. The die pad 30 and a package lead 27 form a part of a lead frame. The package lead 27 is connected via wire 23 to an electrode (not shown) provided on a surface of the semiconductor chip 22 on which circuits are formed. The semiconductor chip 22, the die pad 30, and the package lead 27 are molded with a resin 21. For mounting this QFP type semiconductor package on a circuit board, the package lead 27 which serves as an external connection terminal is soldered onto the circuit board so as to electrically connect the semiconductor package and the circuit board.

FIG. 6B is a diagram showing an exemplary semiconductor package of a conventional CSP (or BGA) type. In such a semiconductor package, a semiconductor chip 22 is adhered onto circuit pattern 26 by using an adhesive film or a paste of a die bond adhesive 25. The circuit pattern 26 is provided on an interposer substrate 28 and connected via wire 23 to an electrode (not shown) provided on a surface of the semiconductor chip 22 on which circuits are formed. Further, the circuit pattern 26 is connected to a solder ball 24 through a penetrate hole 29 provided in the interposer substrate 28. In order to protect the semiconductor chip 22 and the wire 23, a surface of the interposer substrate 28 on which the semiconductor chip 22 is mounted is molded with a resin 21. For mounting this CSP type semiconductor package on a circuit board, the solder ball 24 is melted and soldered onto the circuit board so as to electrically connect the semiconductor package and the circuit board. Although the size of the semiconductor package is slightly larger than the size of the semiconductor chip, this CSP type semiconductor package is much smaller and lighter than the conventional QFP type semiconductor package.

A semiconductor package which allows a further miniaturization is disclosed in Japanese Laid-Open Publication No. 61-50344. As shown in FIG. 6C, such a semiconductor package comprises a conductive adhesive resin layer 32 and a semiconductor chip 22 which have the same size, and the conductive adhesive resin layer 32 is provided on a surface of the semiconductor chip 22 on which electrodes 31 are provided.

Recently, as electronic devices are becoming smaller, the thicknesses of circuit boards have been reduced. For placing components in a small and complicated-shape space inside a small portable device with high density, a Flexible Printed Circuit (FPC) which can be freely bent is becoming more popular. Another method which has been proposed for producing a small and light device is to pattern circuits directly onto a housing forming an electronic device.

In such a circumstance, the conventional semiconductor packages described above have the following problem. Even if a thin substrate or a flexible circuit board can be bent (deformed) into a complicated shape in a small portable device, a semiconductor package is rigid and unbendable. Therefore, the semiconductor package which cannot be deformed mounted on the flexible circuit board which can be freely bent, prevents the circuit board from being accommodated in a small and complicated-shape space inside a small portable device. Furthermore, it is difficult to mount the rigid and unbendable semiconductor package on circuits formed on a curved surface of a housing.

The above described problem is troublesome particularly when accommodating a circuit board on which a large semiconductor package is mounted in a small portable device. The large semiconductor package can be either a large-size semiconductor package which accommodates a semiconductor chip which is increased in size as a circuit scale and a memory capacity mounted on an electronic device increase, or a multi-chip package which accommodate a plurality of semiconductor chips within a single package. Specifically, mounting the semiconductor package onto the circuit board affects a deformation, and bending property of the flexible circuit board. Thus, the circuit board on which the semiconductor package is mounted cannot be accommodated in the small portable device by making use of the properties of the flexible circuit board that can freely deform and bend. Accordingly, the conventional semiconductor package may prevent an implementation of mounting of components with high-density and miniaturization of the devices.

Furthermore, as the portable devices become smaller, and as electronic components comprised in the portable devices use much higher frequencies, problems such as interactions among electronic components including semiconductor chips during an operation, electromagnetic wave disturbances, electromagnetic wave noise, and the like are less likely to occur. Particularly, a thin semiconductor package is susceptible to electromagnetic wave noise. Therefore, a serious problem may occur in the miniaturized portable device.

SUMMARY OF THE INVENTION

According to one aspect of the present invention, there is provided a semiconductor package, comprising: a semiconductor chip having circuits formed on a surface, and having a thickness of 0.5 μm or more and 100 μm or less; and an adhesive resin layer provided so as to cover the surface of the semiconductor chip on which the circuits are provided.

In one embodiment of the present invention, a reinforcing member is provided on a back surface of the semiconductor chip which is opposite to the back surface on which the circuits are provided.

In one embodiment of the present invention, the adhesive resin layer comprises an anisotropic conductive material.

In one embodiment of the present invention, the reinforcing material comprises a polyimide resin or a polysilicone varnish.

In one embodiment of the present invention, the reinforcing material comprises a polyimide resin or a polysilicone varnish.

In one embodiment of the present invention, protruded electrodes are formed on electrodes formed on the surface of the semiconductor chip on which the circuits are formed.

In one embodiment of the present invention, at least one of the adhesive resin layer and the reinforcing member comprises a solid material having an electromagnetic wave shielding property.

In one embodiment of the present invention, the solid material having an electromagnetic wave shielding property comprises ferrite.

According to another aspect of this invention, there is provided a method for producing a semiconductor package comprising the steps of: grinding a back surface of a wafer having a plurality of semiconductor chips and circuits formed on a front surface to a thickness of 0.5-100 µm; forming a reinforcing member on the back surface of the wafer; forming an adhesive resin layer on a surface of the wafer; and dicing the wafer to separate the wafer into semiconductor packages.

According to still another aspect of this invention, there is provided a method for producing a semiconductor package comprising the steps of: forming an adhesive resin layer on a surface of a wafer having a plurality of semiconductor chips and circuits formed on the front surface; grinding a back surface of the wafer to a thickness of 0.5-100 µm; forming a reinforcing member on the back surface of the wafer; and dicing the wafer to separate the wafer into semiconductor packages.

In one embodiment of the present invention, an anisotropic conductive material is used for the adhesive resin layer.

In one embodiment of the present invention, wherein an anisotropic conductive material is used for the adhesive resin layer.

In one embodiment of the present invention, the step of forming the adhesive resin layer comprises forming the adhesive resin layer so as not to cover a periphery of the wafer in order to expose scribe lines of the periphery of the wafer.

In one embodiment of the present invention, the step of forming the adhesive resin layer comprises forming the adhesive resin layer so as not to cover a periphery of the wafer in order to expose scribe lines of the periphery of the wafer.

In one embodiment of the present invention, the step of forming the adhesive resin layer comprises forming the adhesive resin layer so as not to cover a periphery of the wafer in order to expose scribe lines of the periphery of the wafer.

In one embodiment of the present invention, the step of forming the adhesive resin layer comprises forming the adhesive resin layer so as not to cover a periphery of the wafer in order to expose scribe lines of the periphery of the wafer.

The function of the present invention will be described below.

According to one aspect of the invention, the semiconductor chip is formed to have a thickness of 0.5-100 µm and an adhesive resin layer is formed on a surface of the semiconductor chip on which circuits are formed. Thus, the semiconductor chip can be freely bent. Therefore, the semiconductor chip does not affect the properties of a flexible circuit board that can be freely bent, and can be accommodated in a small and complicated-shape space inside a small portable device. Furthermore, it is possible to mount the semiconductor package on a curved substrate or a curved surface of a housing forming an electronic device.

In general, a semiconductor chip having a thickness of about 200-400 µm is used. According to one aspect of the invention, the thickness of the semiconductor chip is reduced to 100 µm or less, so that the semiconductor chip is flexible and resistant to a bending stress. Since the thickness of a diffusion layer forming the semiconductor chip is about 0.2 µm, in order to obtain a sufficient electric property, the thickness of the semiconductor chip should be 0.5 µm or more.

Electrodes of such a semiconductor package are aligned with electrodes of a flexible circuit board. The electrodes of the semiconductor package and the electrodes of the flexible circuit board are pressed, and an adhesive resin layer is cured. Thus, the semiconductor package can be mounted.

For the adhesive resin layer, a thermosetting adhesive resin or a thermoplastic adhesive resin which is capable of connecting the electrodes of the semiconductor chip and the electrodes of the circuit board by pressing and heating, or an anisotropic adhesive resin is used. A bonding tool which can conform to a curved substrate or a curved surface of a housing forming an electronic device is used. Thus, the electrodes of the semiconductor chip and the electrodes of the circuit board can be readily connected, with the semiconductor chip being bent. Particularly, when the anisotropic adhesive resin including conductive particles is used, reliability of conductivity of the connecting portion is improved.

By reducing the thickness of the semiconductor chip as such, damages in the semiconductor chip such as a crack are more likely to occur. Therefore, it is preferable to form a reinforcing member on a surface of the semiconductor chip, which is opposite to a surface on which circuits are formed, (a back surface). Usually, on the back surface of the semiconductor chip, there are scratches caused by grinding. By filling in such scratches, the semiconductor chip can be more resistant to a formation of a crack when it is bent. Therefore, the semiconductor chip can be bent without suffering damage. Particularly, for protecting the back surface of the semiconductor chip without affecting the bending of the semiconductor chip, a polyimide resin, a polysilicone varnish, or the like may be used. It is further preferable to remove portions having the scratches with wet etching after the back surface is ground.

By forming protruded electrodes on the electrodes formed on the surface of the semiconductor chip, the electrodes are readily and securely connected to electrodes of the substrate (for example, a flexible circuit board). In the case where a protruded electrode is not provided on the semiconductor chip, protruded electrodes may be formed on the substrate.

Furthermore, at least one of the adhesive resin layer and the reinforcing member comprises a solid material having an electromagnetic wave shielding property, such as ferrite. Thus, electromagnetic wave noise from the semiconductor chip to the outside of the semiconductor chip and from the outside of the semiconductor chip to the semiconductor chip can be effectively removed.

In the step of forming the adhesive resin layer on the wafer, the adhesive resin layer is formed so as not to cover a periphery of the wafer. Thus, scribe lines on the periphery of the wafer can be seen, providing an alignment means for dicing in a later process.

Thus, the invention described herein makes possible the advantages of providing (1) a semiconductor package which can be bent, does not affect properties of a flexible circuit board that can be freely bent, and can be readily mounted on a curved surface, and a production method thereof; and (2) a semiconductor package which can shield noise from the outside of the semiconductor chip to the semiconductor chip and from the semiconductor chip to the outside of the semiconductor chip by shielding the semiconductor package from an electromagnetic wave, and a production method thereof.

These and other advantages of the present invention will become apparent to those skilled in the art upon reading and understanding the following detailed description with reference to the accompanying figures.

DESCRIPTION OF THE PREFERRED EMBODIMENTS

Hereinafter, the embodiments of the present invention will be described with reference to the drawings.

Embodiment 1

Figure 1A:
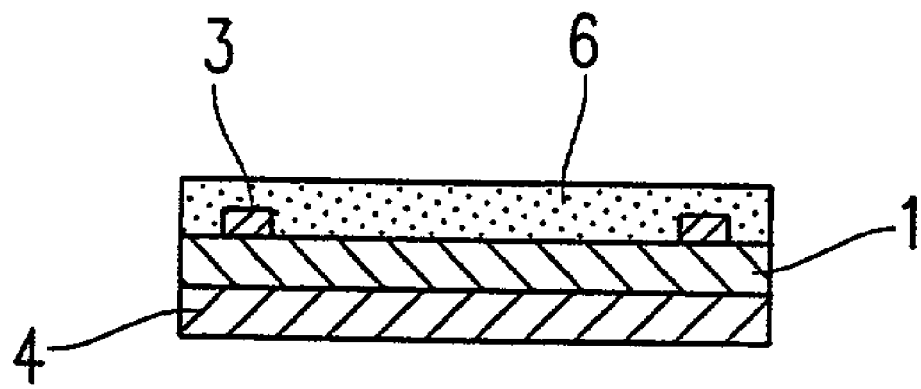
FIGS. 1A and 1B are cross-sectional views illustrating a structure of a semiconductor package according to Embodiment 1.

FIG. 1A is a cross-sectional view illustrating a structure of a semiconductor package according to one embodiment of the present invention. The semiconductor package comprises a semiconductor chip 1. On a surface of the semiconductor chip 1, circuit elements such as electrodes and active elements (not shown) are provided. The thickness of a semiconductor chip 1 is about 0.5-100 µm so that the semiconductor package can be flexibly bent when it is mounted on a circuit formed on a flexible circuit board or a housing of an electronic device. On the surface of the semiconductor chip 1 on which the circuits such as electrodes and active elements (not shown) are provided, an adhesive resin layer 6 is provided. By providing the adhesive resin layer 6, the semiconductor package 1 can be readily connected to the circuits formed on the flexible circuit board or the housing of the electronic device. In the present embodiment, in order to improve reliability of conductivity of a connected portion, an adhesive resin layer 6 comprising an anisotropic conductive material is used. Since the thickness of the semiconductor chip 1 is reduced, for preventing a crack or the like, a reinforcing member 4 is provided on a back surface of the semiconductor chip 1, which is opposite to the surface on which the circuits are formed. The reinforcing member 4 is a flat plate provided across the back surface of the semiconductor chip 1. On electrodes of the semiconductor chip 1 (not shown), protruded electrodes 3 are provided.

Figure 1B:
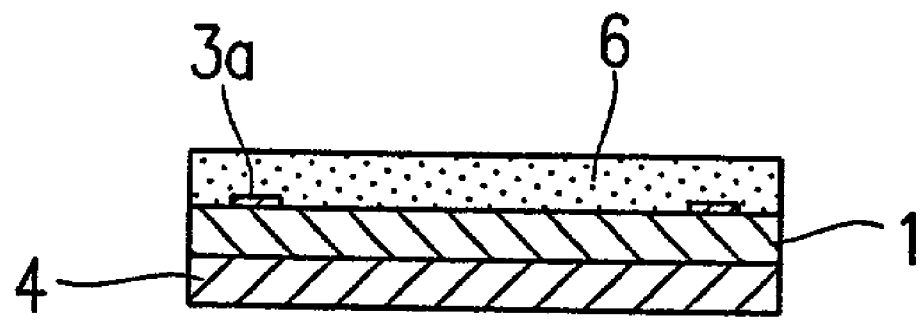

In the semiconductor package shown in FIG. 1A, the protruded electrodes 3 of about 3-5 µm height are provided on the electrodes of the semiconductor chip 1 (not shown) so as to improve connections between electrodes on the flexible circuit board or the housing on which the semiconductor chip 1 is mounted and the electrodes of the semiconductor chip 1. However, as shown in FIG. 1B, a structure without a protruded electrode may be used. In FIG. 1B, protruded electrodes are provided on the flexible circuit board or the housing on which the semiconductor chip 1 is mounted so as to improve connections between the protruded electrodes and electrodes 3a of the semiconductor chip 1.

FIGS. 2A through 2E are cross sectional views illustrating a production process of the semiconductor package shown in FIG. 1A.

Figure 2A:
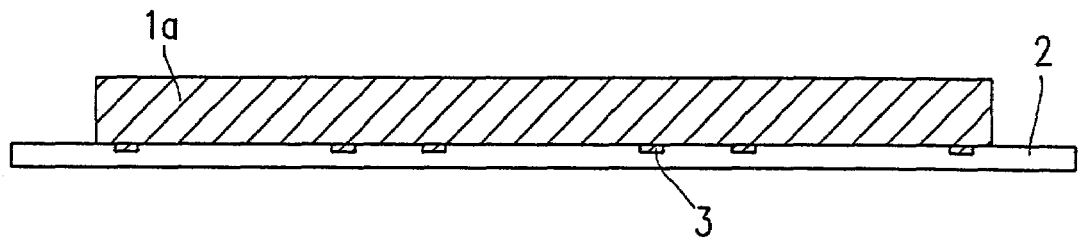
FIGS. 2A through 2E are cross sectional views illustrating a production process of the semiconductor package according to Embodiment 1.

In FIG. 2A, similar to a usual production process for a semiconductor device, a wafer 1a is first provided. On a surface of the wafer 1a, circuits such as active elements and electrodes are formed whereby multiple semiconductor chips 1 are formed on the wafer 1a. On the surface of the wafer 1a on which the circuits are formed, an adhesive sheet 2 comprising an ultra-violet curing adhesive layer (not shown) is adhered. To obtain a structure shown in FIG. 1A, protruded electrodes 3 are provided on an electrode formed on the surface of the wafer 1a. The protruded electrode 3 are formed by sequentially forming a nickel layer and a gold layer of about 3-5 µm height with electrolytic plating or electroless plating. The thickness of the wafer 1a at this moment is about 200-700 µm.

Figure 2B:
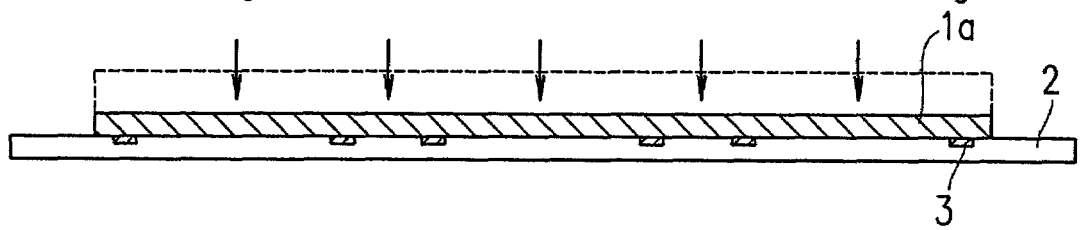

Next, as shown in FIG. 2B, the back surface of the wafer 1a is mechanically ground by a grinder to reduce the thickness thereof. With the mechanical grinding, the wafer 1a can be ground to a thickness of about 50-100 µm, depending on the conditions. However, further reduction in the thickness of the wafer 1a by mechanical grinding may results in damage of the wafer 1a. Therefore, for further reducing the thickness of the wafer 1a, it is preferable to use a method less likely to cause damage during a process, such as chemical etching or Chemical Mechanical Polishing (CMP). By reducing the thickness of the semiconductor chip 1 from the conventional thickness of about 300 µm to the thickness of 10 µm or less, for example, bending strength is improved by about 200 to 300 times. Therefore, it is preferable to reduce the thickness of the wafer 1a to about 10-20 µm or less. However, the thickness can be set within a range of about 0.5-100 µm depending on the purpose for which the semiconductor package is used.

Figure 2C:
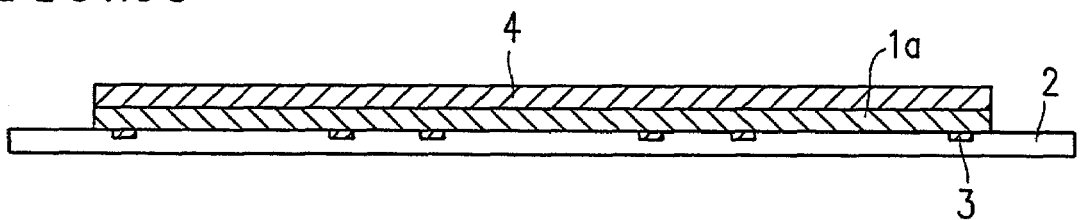

As described above, scratches and areas of roughness caused by grinding or etching of the wafer 1a may be present on the back surface of the wafer 1a. In FIG. 2C, in order to prevent these warping from causing damages such as cracks or chipping in the semiconductor package while it is being mounted or handled after being mounted in a later process, the reinforcing member 4 is provided on the back surface of the wafer 1a.

The reinforcing member 4 may comprise a liquid polyimide resin, a polysilicone varnish, or the like. For example, a polyimide resin available from Hitachi Chemical Co., Ltd.

under the name of PIX, a polysilicone varnish available from GE Toshiba Silicones under the name of TSR-144, or the like may be used. Such liquid material is applied across the back surface of the wafer 1a. Then, the material is cured into a cured film to form the reinforcing member 4 under conditions suitable for curing. For example, TSR-144 is a polysilicone varnish which can be cured at room temperature. It is preferably cured in about 1 minute by heating and drying in an oven heated to about 80-120° C. Preferably, the thickness of the reinforcing member 4 is limited to be 300 μm or less to avoid affecting the bending strength and 0.5 μm or more to avoid damage such as cracks forming in the semiconductor chip 1.

Figure 2D:
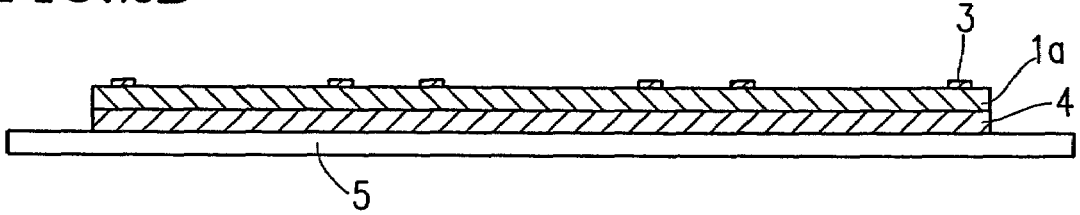

As shown in FIG. 2D, the wafer 1a is peeled off from the adhesive sheet 2 by irradiation with ultraviolet rays and adhered to a new adhesive sheet 5 for dicing from the side on which the reinforcing member 4 is formed. In the case where the liquid polyimide resin such as PIX is used for the reinforcing member 4, since the curing temperature is about 350° C., the wafer 1a is previously removed from the adhesive sheet 2, the PIX is cured, and after the curing of the Pix is finished, the adhesive sheet 5 for dicing is adhered.

Figure 2E:
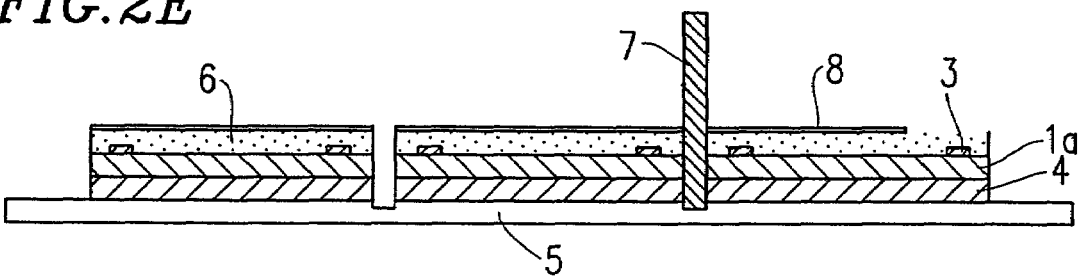

In FIG. 2E, an Anisotropic Conductive Film (ACF) is adhered to form the adhesive resin layer 6 on the surface of the wafer 1a on which the circuits are formed. The ACF includes conductive particles dispersed in an adhesive resin. The conductive particles may be metal particles, plastic particles covered with metal layers, or the like. As shown in FIG. 2E, a protection sheet (laminated film) 8 is adhered to one side of the adhesive resin layer 6. If the ACF 6 is provided across the surface of the wafer 1a, a scribe line of the wafer 1a cannot be seen. In such a structure, it is difficult to perform dicing. Thus, preferably, a periphery of the wafer 1a of about few millimeters (for example, 3 mm) is not covered with the ACF 6. Thus, when dicing is performed in a later process, a dicing blade 7 and the scribe line can be readily aligned.

Then, the wafer 1a is cut into separate semiconductor packages by the dicing blade 7 from the side on which the circuits are formed. Thus, the semiconductor packages of the present embodiment are obtained.

Figure 3A:
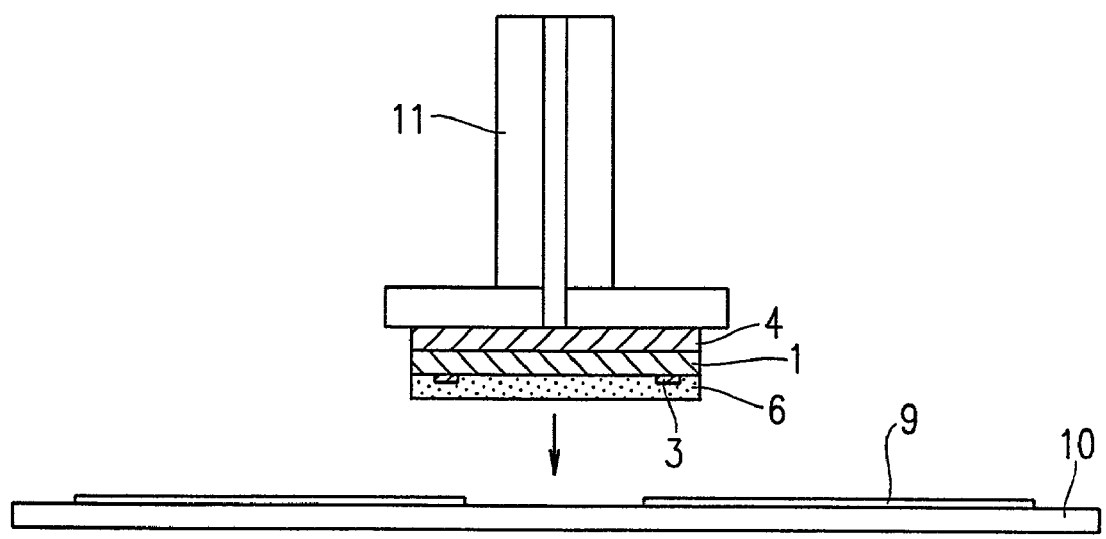
FIGS. 3A and 3B are cross-sectional views illustrating the steps of mounting the semiconductor package according to Embodiment 1 on a flexible circuit board.
Figure 3B:
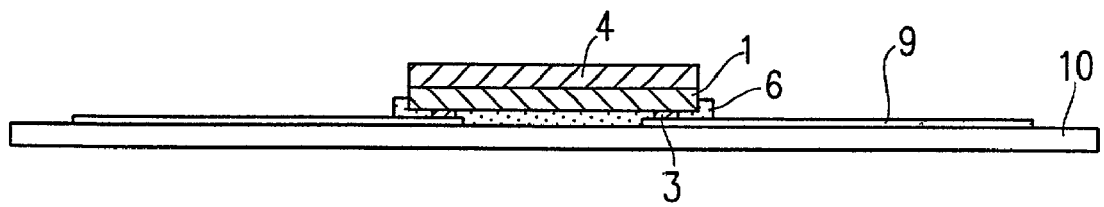

FIGS. 3A and 3B are cross-sectional views illustrating the steps of mounting the semiconductor package according to the present embodiment on a substrate such as a flexible circuit board.

In FIG. 3A, the protection laminated film 8 is peeled off from the ACF 6 and the reinforcing member 4 is adsorbed to a bonding tool 11. In FIG. 3B, the protruded electrodes 3 are aligned with electrodes on a flexible circuit board 10 (circuit pattern 9). The device is heated with the protruded electrode 3 and the circuit pattern 9 being pressed to be in contact.

According to the present invention, for example, in the case where a flexible circuit board comprising a polyimide resin as a base substrate is used, it is possible to deform the semiconductor chip so as to conform to the deformation of the flexible circuit board. Furthermore, it is possible to mount the semiconductor package on a curved surface by using a bonding tool which conforms to a curved substrate or a curved surface of a housing forming an electronic device.

Embodiment 2

Figure 4A:
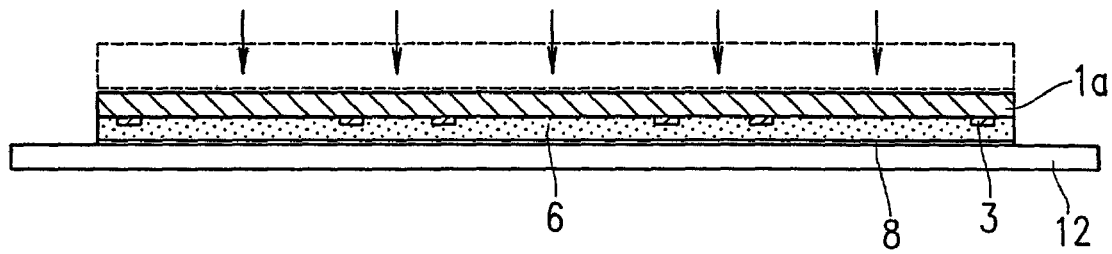
FIGS. 4A through 4C are cross sectional views illustrating a production process of a semiconductor package according to Embodiment 2.
Figure 4B:
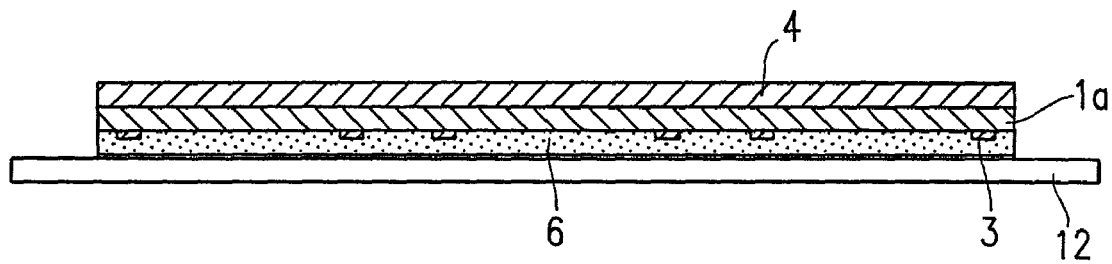
Figure 4C:
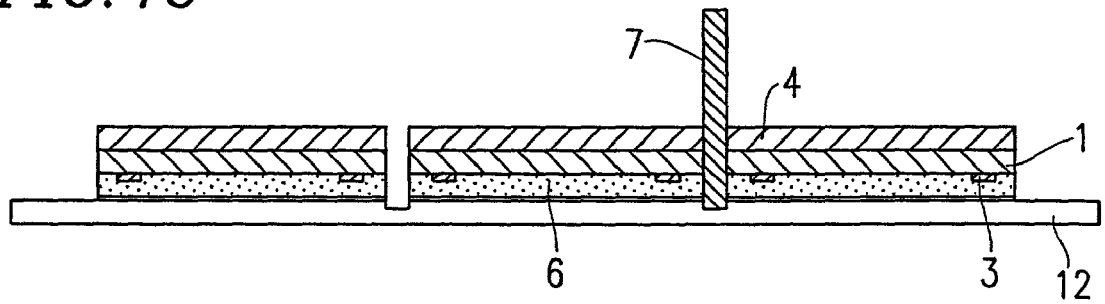

FIGS. 4A through 4C are cross sectional views illustrating a production process of another embodiment of the semiconductor package according to the present invention.

The semiconductor package of the present embodiment has a similar structure as that of the semiconductor package shown in FIG. 1A. The thickness of a semiconductor chip 1 of the semiconductor package is about 0.5-100 μm so that the semiconductor package can be flexibly bent when it is mounted on circuits formed on a flexible circuit board or a housing of an electronic device. On a surface of the semiconductor chip 1 on which the circuits such as electrodes 3 and active elements (not shown) are provided, an adhesive resin layer 6 is provided. By providing the adhesive resin layer 6, the semiconductor package can be readily connected to the circuits formed on the flexible circuit board or the housing of the electronic device. In order to improve reliability of conductivity of a connected portion between the semiconductor package and the circuits formed on the flexible circuit board or the housing of the electronic device, an adhesive resin layer 6 comprising an anisotropic conductive material is used. Since the thickness of the semiconductor chip 1 is reduced, for preventing a crack or the like, a plate-shape reinforcing member 4 is provided across a back surface of the semiconductor chip 1, which is opposite to the surface on which the circuits are formed. On the electrodes of the semiconductor chip 1 (not shown), the protruded electrodes 3 are provided. In addition to the structure of the semiconductor package shown in FIG. 1A, the adhesive resin layer 6 and the reinforcing member 4 of the present embodiment comprises a solid material having an electromagnetic wave shielding property.

FIGS. 4a through 4C are cross sectional views illustrating the production process of the semiconductor package according to the present embodiment. In the present embodiment, after the step of forming the adhesive resin layer 6, the step of grinding the back surface of the semiconductor chip 1 to reduce the thickness of the semiconductor chip 1 is performed.

In FIG. 4A, similar to a usual production process for a semiconductor device, a wafer 1a is first provided. On a surface of the wafer 1a, circuits such as active elements and electrodes are formed whereby multiple semiconductor chips 1 are formed on the wafer 1a. On the surface of the wafer 1a on which the circuits are formed, an ACF 6 is adhered as a thermosetting adhesive sheet. To one side of the ACF 6, a laminated film 8 is adhered to prevent contamination. The laminated film 8 is adhered to an adhesive sheet 12 including an ultra-violet curing adhesive layer (not shown). In the present embodiment, the ACF 6 comprises ferrite ($Fe_2MnO_4$) particles having diameters of 3-5 μm from 30% to 60% by weight as a solid material having an electromagnetic wave shielding property Since ferrite has a high resistance, it may result in a poor connection between the semiconductor package and the circuit board. However, in practice, although the ACF 6 comprises $SiO_2$ as a filler, a problem may not occur, and the ferrite particles do not cause a particular problem. This is because, when pressure-welding the semiconductor chip and the circuit pattern, most of the filler between the protruded electrode and the circuit pattern are discharged and do not remain therebetween, and only a small amount of the filler and the ferrite particles are buried into the protruded electrode or the circuit pattern. Since the protruded electrode is made of gold in most cases, hard particles such as $SiO_2$ or $Fe_2MnO_4$ become buried in the gold. Even if other materials are used for protruded electrodes such as nickel and copper, and materials such as copper plated with nickel or gold are used for the circuit pattern, the particles of $SiO_2$ or $Fe_2MnO_4$ are still harder than these materials and are still buried into these materials.

Therefore, the contact between the protruded electrode and the circuit pattern may not be deteriorated.

Then, similar to the first embodiment, the step of reducing the thickness of the wafer by grinding or etching the back surface of the wafer 1a is performed. As shown in FIG. 4B, the reinforcing member 4 is provided on the back surface of the wafer 1a.

The reinforcing member 4 may comprise, for example, a polysilicone varnish available from GE Toshiba Silicones under the name of TSR-144, or the like. Such liquid material is applied across the back surface of the wafer 1a. Then, the material is cured into a cured film to form the reinforcing member 4 under conditions suitable for curing. For example, TSR-144 is a polysilicone varnish which can be cured at room temperature. It is preferably cured in about 1 minute by heating and drying in an oven heated to about 80-120° C. If the adhesive resin layer 6 having a thermosetting property is cured in this circumstance, the reinforcing member 4 is cured at room temperature. In the present embodiment, ferrite ($Fe_2MnO_4$) particles having diameters of 3-5 µm is mixed into polysilicone varnish from 60% to 90% by weight as the solid material having the electromagnetic wave shielding property to form the reinforcing member 4.

In FIG. 4C, the wafer 1a is cut into separate semiconductor packages by the dicing blade 7 from the back surface of the wafer 1a, i.e., the side of the reinforcing member 4. Thus, the semiconductor packages of the present embodiment are obtained.

In the present embodiment, the ACF and the polysilicone varnish comprise the ferrite particles as a solid material having the electromagnetic wave shielding property. Therefore, electromagnetic wave noise from the outside of the semiconductor chip to the semiconductor chip 1 and from the semiconductor chip 1 to the outside of the semiconductor chip can be effectively removed. Accordingly, the noise is less likely to be emitted from the semiconductor chip 1 to an exterior circuit board and from the exterior circuit to the semiconductor chip 1. As a result, a malfunction of the semiconductor chip 1 is prevented and the semiconductor chip 1 operates in a normal and stable manner.

Figure 5:
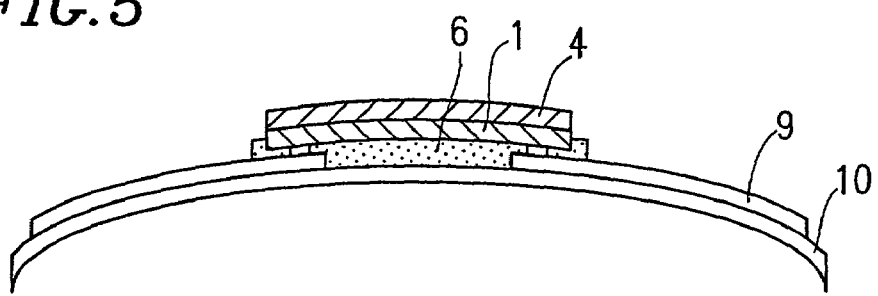
FIG. 5 is a cross-sectional view illustrating the semiconductor package according to Embodiment 2 which is mounted on a flexible circuit board and bent.
Figure 6A:
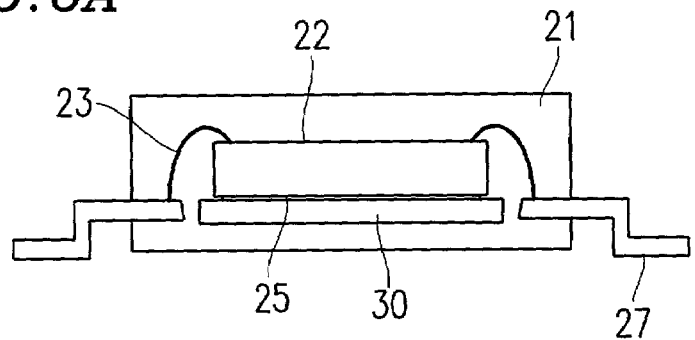
FIGS. 6A and 6B are a diagram showing a structure of a conventional semiconductor package.
Figure 6B:
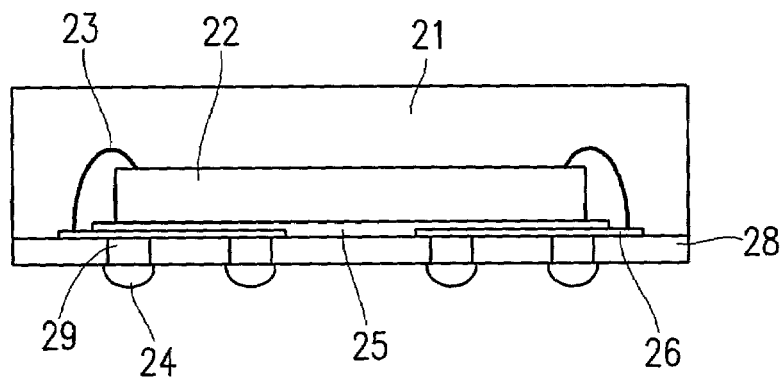
Figure 6C:
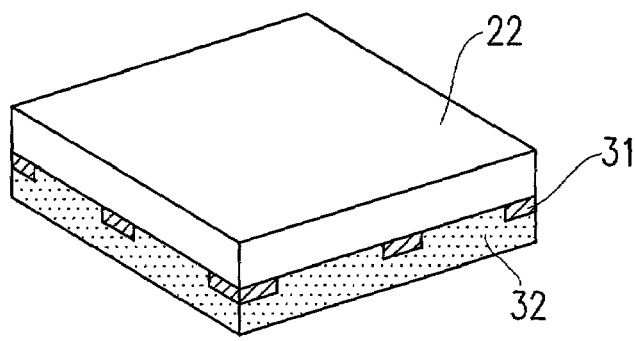
FIG. 6C is a perspective view showing a structure of a conventional semiconductor package.

FIG. 5 is a cross-sectional view illustrating the semiconductor package of the present embodiment which is mounted on a flexible circuit board which is bent.

As shown in FIG. 5, according to the present embodiment, since the thickness of the semiconductor chip 1 is thin, the semiconductor chip 1 can be deformed so as to conform to the deformation of the flexible circuit board. By using a bonding tool which can conform to a curved substrate or a curved surface of the housing forming an electronic device, the semiconductor chip 1 can be deformed so as to conform to the shape of the curved surface. Therefore, it is possible to mount the semiconductor package to the curved surface.

In the present embodiment, the laminated film 8 adhered to the thermosetting adhesive resin layer 6 is adhered to the adhesive sheet 12. However, the adhesive sheet 12 which also serves as a laminated film may be used. In addition, in the present embodiment, both the adhesive resin layer 6 provided on the semiconductor chip 1 and the reinforcing member 4 provided on the back surface of the semiconductor chip 1 comprise the solid material having the electromagnetic wave shielding property. However, the solid material may be mixed into one of them.

As specifically described above, according to the present invention, by limiting the thickness of a semiconductor chip to a range of about 0.5-100 µm, a thin semiconductor package which is resistant to bending stress can be obtained. By providing a reinforcing member on a back surface of the semiconductor chip which is opposite to a surface on which circuits are formed, damages to the semiconductor chip such as cracks can be prevented. By further providing an adhesive resin layer on the surface of the semiconductor chip on which the circuits are formed, the semiconductor package which can be readily mounted on a flexible circuit substrate and a curved-shape substrate can be provided. By mixing a solid material having an electromagnetic wave shielding property into the adhesive resin layer and the reinforcing member, an electromagnetic wave noise is less likely to be emitted from the semiconductor chip to an exterior circuit board. As a result, a malfunction of the semiconductor chip is prevented and the semiconductor chip operates in a normal and stable manner.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor package mounted on a curved surface of a device, said semiconductor package comprising:
    a semiconductor chip having circuits formed on a surface, and having a thickness of 0.5 µm or more and 100 µm or less such that said semiconductor package is flexibly bent to conform to said curved device on which said semiconductor package is mounted;
    an adhesive resin layer provided so as to cover the surface of the semiconductor chip on which the circuits are formed; and
    a reinforcing member directly attached to substantially an entire back surface of the semiconductor chip, which is opposite to the surface on which the circuits are formed, such that scratches on the back surface of the semiconductor chip are filled so as to prevent cracking in the semiconductor chip,
    wherein the material of said reinforcing member comprises a polyimide resin or a polysilicone varnish.

2. A semiconductor package according to claim 1, wherein the adhesive resin layer comprises an anisotropic conductive material.

3. A semiconductor package according to claim 1, wherein protruded electrodes are formed on electrodes formed on the surface of the semiconductor chip on which the circuits are formed.

4. A semiconductor package according to claim 1, wherein at least one of the adhesive resin layer and the reinforcing member comprises a solid material having an electromagnetic wave shielding property.

5. A semiconductor package according to claim 4, wherein the solid material having an electromagnetic wave shielding property comprises ferrite.

6. A semiconductor package according to claim 1, wherein said reinforcing member is of sufficient thickness to prevent the cracking in the semiconductor chip.

7. A semiconductor device, comprising:
    a flexible circuit board that is capable of being bent to form a curved surface;
    a circuit pattern formed on a surface of the flexible circuit board; and
    a semiconductor package pressed and flexibly bent to conform to the curved surface of said flexible circuit board,
    wherein the semiconductor package comprises,
        a semiconductor chip having circuits formed on a surface, and having a thickness of 0.5 µm or more and 100 μm or less such that said semiconductor package is capable of being flexibly bent to conform to the curved surface of said flexible circuit board;

a plurality of protruded electrodes formed on the surface of the semiconductor chip on which the circuits are formed and are pressed to be in contact with the circuit pattern;

a reinforcing member directly attached to substantially an entire back surface of the semiconductor chip, which is opposite to the surface on which the circuits are formed, such that scratches on the back surface of the semiconductor chip are filled so as to prevent cracking in the semiconductor chip, wherein the material of said reinforcing member comprises a polyimide resin or a polysilicone varnish; and an adhesive resin layer provided so as to cover the surface of the semiconductor chip on which the circuits are formed.

8. A semiconductor package according to claim 7, wherein the protruded electrodes are about 3 μm to about 5 μm in height.

9. A semiconductor package according to claim 7, wherein the adhesive resin layer covers the plurality of protruded electrodes.

* * * * *